United States Patent
Yu et al.

(10) Patent No.: US 9,720,545 B2
(45) Date of Patent: Aug. 1, 2017

(54) DISPLAY PANEL WITH A TOUCH FUNCTION, MANUFACTURE THEREOF AND COMPOSITE ELECTRODE

(71) Applicant: Shenzhen China Star Optoelectronics Technology Co., Ltd., Shenzhen, Guangdong (CN)

(72) Inventors: Xiaojiang Yu, Guangdong (CN); Wei Zhan, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 191 days.

(21) Appl. No.: 14/433,658

(22) PCT Filed: Jan. 5, 2015

(86) PCT No.: PCT/CN2015/070100
§ 371 (c)(1),
(2) Date: Apr. 4, 2015

(87) PCT Pub. No.: WO2016/101341
PCT Pub. Date: Jun. 30, 2016

(65) Prior Publication Data
US 2016/0342278 A1  Nov. 24, 2016

(30) Foreign Application Priority Data

Dec. 24, 2014 (CN) .......................... 2014 1 0817266

(51) Int. Cl.
*G06F 3/041* (2006.01)
*G06F 3/044* (2006.01)
(Continued)

(52) U.S. Cl.
CPC ........ *G06F 3/0418* (2013.01); *G02F 1/13338* (2013.01); *G02F 1/13439* (2013.01); *G02F 1/133345* (2013.01); *G02F 1/134363* (2013.01); *G02F 1/136227* (2013.01); *G06F 3/044* (2013.01); *G06F 3/0412* (2013.01);
(Continued)

(58) Field of Classification Search
CPC .......... H01L 27/1244; H01L 29/78675; H01L 21/28247; H01L 27/1222
See application file for complete search history.

(56) References Cited

U.S. PATENT DOCUMENTS

2008/0003790 A1* 1/2008 Seo .................. H01L 21/28061
438/585
2008/0259262 A1* 10/2008 Jones ..................... B82Y 10/00
349/139

(Continued)

*Primary Examiner* — Abbas Abdulselam
(74) *Attorney, Agent, or Firm* — Andrew C. Cheng

(57) ABSTRACT

The disclosure is related to a display panel having a touch function and manufacture thereof, and the composite electrode thereof. The display panel comprises a composite electrode. The composite electrode comprises a metal electrode and a metal oxide layer formed on the surface of the metal electrode. Through the above configuration, the dense and insulated metal oxide layer is formed on the surface of the metal electrode of the composite electrode to prevent the composite electrode from forming a short-circuit with the peripheral circuits. Thus the yield for the display panel with a touch function is increased and the cost is reduced.

15 Claims, 2 Drawing Sheets

(51) Int. Cl.
*G02F 1/1333* (2006.01)
*G02F 1/1343* (2006.01)
*G02F 1/1362* (2006.01)
*H01L 21/28* (2006.01)
*H01L 27/12* (2006.01)
*H01L 29/786* (2006.01)

(52) U.S. Cl.
CPC .... *H01L 21/28247* (2013.01); *H01L 27/1222* (2013.01); *H01L 27/1244* (2013.01); *H01L 27/1262* (2013.01); *H01L 29/78675* (2013.01); *G02F 2001/134318* (2013.01); *G02F 2201/121* (2013.01); *G02F 2201/123* (2013.01); *G06F 2203/04103* (2013.01); *G06F 2203/04111* (2013.01)

(56) References Cited

U.S. PATENT DOCUMENTS

2009/0326703 A1* 12/2009 Presley ............. H01L 21/67161
  700/112
2012/0282769 A1* 11/2012 Ryu ................. H01L 21/28061
  438/659

* cited by examiner

DISPLAY PANEL WITH A TOUCH FUNCTION, MANUFACTURE THEREOF AND COMPOSITE ELECTRODE

BACKGROUND

Technical Field

The disclosure is related to the display technology field, and more particular to a display panel having a touch function and manufacture thereof, and the composite electrode thereof.

Related Art

Touch panels are manufactured on the display panel by the in-cell technology or the on-cell technology to form a display panel having a touch function to achieve lightness and thinness for current display panels and to increase the touch and display experience for users. The in-cell technology is an approach embedding the touch function of the display panel into the liquid crystal pixel. The on-cell technology is an approach embedding the display panel having the touch function between the color filter substrate and the planarizing layer.

The electrodes connecting the touch elements and the display elements require closely adjacent arrangement inside the display panel of the touch function. Therefore, the distance between the electrodes is small such that it is easy to form a short circuit. The yield and cost for manufacturing the display panel having the touch function are affected.

SUMMARY

The disclosure provides a display panel having a touch function to solve the above problem.

In order to solve the above problem, the disclosure provides a display panel with a touch function comprising a composite electrode, wherein the composite electrode comprises a metal electrode and a metal oxide layer formed on the surface of the metal electrode.

In one embodiment, the metal oxide layer is formed by oxidation the metal electrode.

In one embodiment, the metal oxide layer is formed by oxidation the metal electrode using UV-ozone or oxygen plasma.

In one embodiment, the metal electrode comprises a single metal layer, at least two metal layers or a metal alloy layer.

In one embodiment, the metal oxide layer electrically isolates the metal electrode from the surrounding the conductive elements.

In one embodiment, the composite electrode is a touch electrode of the display panel.

In one embodiment, the display panel further comprises a substrate, a semiconductor pattern formed on the substrate, a gate insulating layer and a interlayer insulating layer covering the semiconductor pattern and the substrate, a source/drain pattern disposed on the interlayer insulating layer, a planarizing layer covering the source/drain pattern and the interlayer insulating layer, a common electrode pattern disposed on the planarizing layer, a passivation layer covering the common electrode pattern and the planarizing layer, and a pixel electrode pattern disposed on the passivation layer; the touch electrode is disposed on the passivation layer and spaced apart from the pixel electrode pattern; wherein a first contact hole is formed in the planarizing layer and the passivation layer, the pixel electrode pattern electrically contacts with the source/drain pattern through the first contact hole, a second contact hole is formed in the gate insulating layer and the interlayer insulating layer, the source/drain pattern contacts with the semiconductor pattern through the second contact hole.

The disclosure further provides a method for manufacturing a display panel having a touch function, comprising forming a metal electrode; and oxidation the metal electrode to form a metal oxide layer on the surface of the metal electrode.

In one embodiment, the step of oxidation the metal electrode comprises: oxidation the metal electrode by using UV-ozone or oxygen plasma.

In order to solve the above problem, the disclosure further provides a composite electrode adopted for a display panel or a touch panel, wherein the composite comprises a metal electrode and a metal oxide later formed on the surface of the metal electrode.

In one embodiment, the metal oxide layer is formed by oxidation the metal electrode.

In one embodiment, the metal oxide layer is formed by oxidation the metal electrode using UV-ozone or oxygen plasma.

In one embodiment, the metal electrode comprises a single metal layer, at least two metal layers or a metal alloy layer.

In one embodiment, the metal oxide layer electrically isolates the metal electrode from the surrounding the conductive elements.

The beneficial effects of the disclosure through the above solutions are as below. What is distinguished from the current technology is that the display panel having the touch function of the embodiment comprises a composite electrode. And the composite electrode comprises a metal electrode and a metal oxide layer formed on the surface of the metal electrode. Therefore, the display panel having the touch function of the disclosure may prevent a short circuit from being formed with the surrounding circuits. The yield of the display panel having the touch function is increased and the cost is reduced.

BRIEF DESCRIPTION OF THE DRAWINGS

The above and other exemplary aspects, features and advantages of certain exemplary embodiments of the present disclosure will be more apparent from the following description taken in conjunction with the accompanying drawings, in which.

DETAILED DESCRIPTION

The following description with reference to the accompanying drawings is provided to explain the exemplary embodiments of the disclosure.

Figure 1:
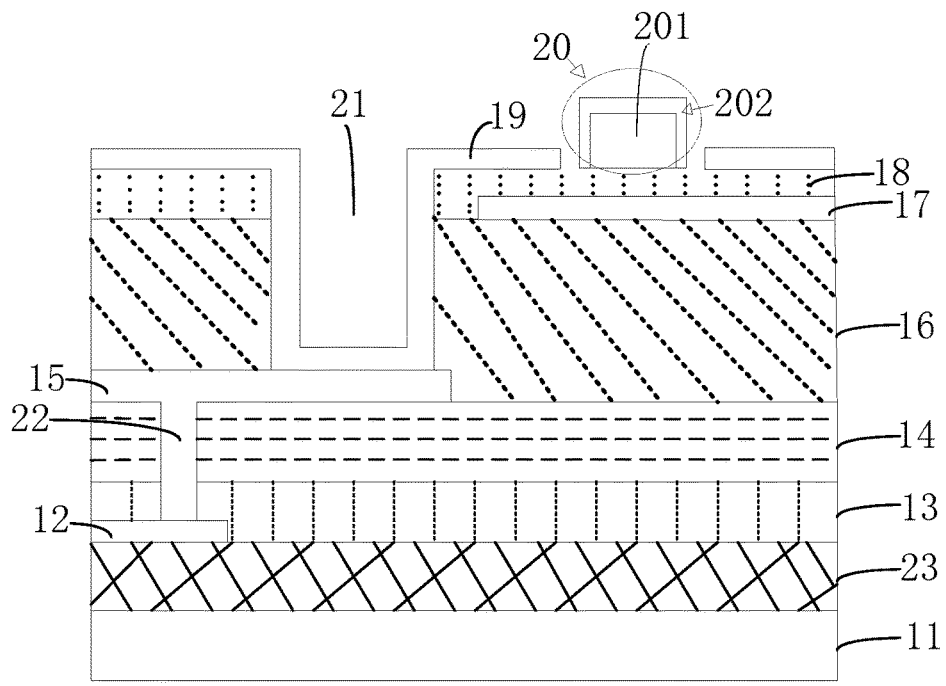
FIG. 1 is a schematic structure diagram of the display panel having the touch function according to the disclosure.

For the current display panel having a touch function (referred as the touch display panel), the electrodes connecting the touch elements and the display elements require closely adjacent arrangement inside the display panel having the touch function. Therefore, the distance between the electrodes is small such that it is easy to form a short circuit. The disclosure provides a display panel having a touch function. The display panel comprises a composite electrode having a metal electrode and a metal oxide layer formed on the surface of the metal electrode. With reference to FIG. 1, FIG. 1 is a schematic structure diagram of the display panel having a touch function according to the disclosure. The display panel having a touch function comprises a substrate 11, a semiconductor pattern 12 formed on the substrate 11, a gate insulating layer 13 and a interlayer insulating layer 14 covering the semiconductor pattern 12 and the substrate 11, a source/drain pattern 15 disposed on the interlayer insulating layer 14, a planarizing layer 16 covering the source/drain pattern 15 and the interlayer insulating layer 14, a common electrode pattern 17 disposed on the planarizing layer 16, a passivation layer 18 covering the common electrode pattern 17 and the planarizing layer 16, and a pixel electrode pattern 19 disposed on the passivation layer 18, a composite electrode 20 disposed on the passivation layer 18 and spaced apart from the pixel electrode pattern 19. A first contact hole 21 is formed in the planarizing layer 16 and the passivation layer 18. The pixel electrode pattern 19 electrically contacts with the source/drain pattern 15 through the first contact hole 19. A second contact hole 22 is formed in the gate insulating layer 13 and the interlayer insulating layer 14. The source/drain pattern 15 contacts with the semiconductor pattern 12 through the second contact hole 22. Further, a buffer layer 23 is formed on the substrate 11.

In this embodiment, the display panel having a touch function is a Low Temperature Poly-silicon (LTPS) liquid crystal display panel manufactured by the in-cell technology. Such panels have the advantages such as thinness, light weight, low power consumption, clearer images and more brilliant colors and etc. The substrate 11 is usually a glass substrate. The buffer layer 23 is formed on the substrate 11 by PECVD process, and covers the entire substrate 11. The buffer layer 23 may reduce the current leakage. In one embodiment, the semiconductor pattern 12 is formed on the buffer layer 23 of the substrate 11. The gate insulating layer 13 is generally formed by depositing an oxidation layer of TEOS, SiNx or SiH4 on the substrate 11 by PECVD process. The interlayer insulating layer 14 covers the gate insulating layer 13. The source/drain pattern 15 is formed in the interlayer insulating layer 14 and is spaced apart from the gate insulating layer 13. The second contact hole 22 is formed in the gate insulating layer 13 and the interlayer insulating layer 14 such that the source/drain in the source/drain pattern 15 may contacts with the semiconductor pattern 12 through the second contact hole 22.

The planarizing layer 16 covers the source/drain pattern 15 and the entire interlayer insulating layer 14. The planarizing layer 16 is an organic planarizing layer. The planarizing layer 16 may enhance the efficiency of the liquid crystal. The common electrode pattern 17 is formed on the planarizing layer 16. The passivation layer 18 covers the common electrode pattern 17 and the entire planarizing layer 16. The pixel electrode pattern 19 and the composite electrode 20 are formed on the passivation layer 18. The composite electrode 20 is spaced apart from the pixel electrode pattern 19. The first contact hole 21 is formed in the passivation layer 18 and the planarizing layer 16 such that the pixel electrode pattern 19 may contact with the source/drain pattern 15 through the first contact hole 21. The electrical connection between the source/drain pattern 15 and the semiconductor pattern 12 through the second contact hole 22 achieves the electrical connection between the pixel electrode pattern 19 and the semiconductor pattern 12 such that the entire electrical connection is completed for the whole display panel 1 with the touch function.

The composite electrode 20 of this embodiment is a touch electrode, comprising a metal electrode 201 and a metal oxide layer 202 formed on the surface of the metal electrode. The metal oxide layer 202 is formed by oxidizing the metal electrode 201. The oxidation treatment adopts UV-ozone or oxygen plasma to oxidize the metal electrode 201 to form the metal oxide layer 202. The metal oxide layer 202 is used to electrically insulate the metal electrode 201 from the surrounding the conductive elements to prevent a short circuit from being formed between the metal electrode 201 and the other electrodes. This indicates the electrical insulation between the composite electrode 20 and the pixel electrode pattern 19, and in the meanwhile indicates the electrical insulation between the composite electrode 20 and the other circuits such that the short circuit with the surrounding circuits is prevented. In one embodiment, the metal electrode 201 may be a single metal layer (such as Al), at least two metal layers (such as Al/Ti bimetallic layer), or a metal alloy layer (such as Al—Ti alloy).

It is noted herein that the above embodiments merely explain the function of the composite electrode 20 by the exemplary display panel 1 having the touch function. Besides, in other embodiments, the composite electrode 20 may also be used for the display panel or the touch panel. The composite electrode 20 comprises a metal electrode 201 and a metal oxide layer 202 disposed on the surface of the metal electrode 201.

What is distinguished from the current technology is that the display panel 1 having the touch function of the embodiment comprises a composite electrode 20. And the composite electrode 20 comprises a metal electrode 201 and a metal oxide layer 202 formed on the surface of the metal electrode 201 such that the composite electrode 20 is electrically insulated from the surrounding conductive elements, and the short circuit with the surrounding conductive elements is prevented. The yield of the display panel 1 having the touch function is increased.

Figure 2:
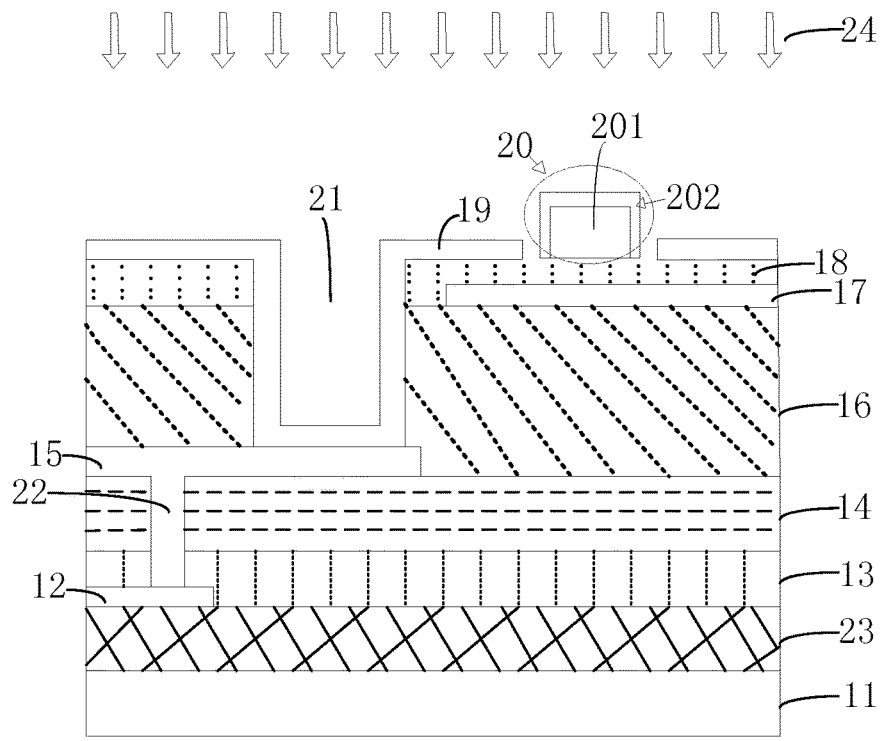
FIG. 2 is the flow chart for the manufacture method of the display panel having the touch function according to the disclosure.
Figure 3:
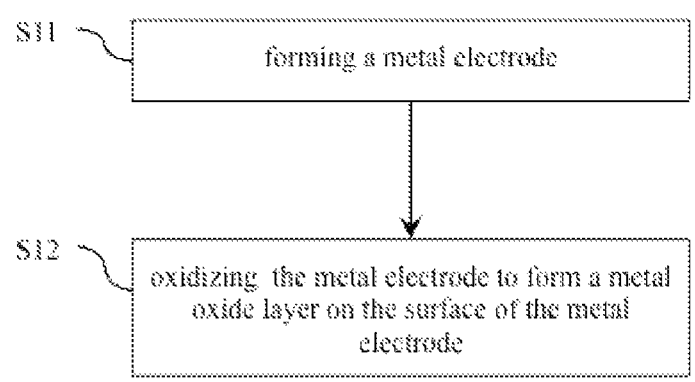
FIG. 3 is the flow chart for the manufacture method for the composite electrode of the display panel having the touch function according to the disclosure.

With reference to FIG. 2 and FIG. 3 in combination with FIG. 1, FIG. 2 is the flow chart for the manufacture method of the display panel having the touch function according to the disclosure. FIG. 3 is the flow chart for the manufacture method for the composite electrode of the display panel having a touch function according to the disclosure. The manufacture process for the display panel 1 having the touch function according to the embodiment comprises:

S11: forming a metal electrode.

The metal electrode 201 is formed by a single metal layer, at least two metal layers or a metal alloy layer.

In this embodiment, a semiconductor pattern 12 is first formed on the substrate 11 of the display panel 1 having the touch function, and then a gate insulating layer 13 and a interlayer insulating layer 14 covering the semiconductor pattern 12 and the substrate 11 is formed. The interlayer insulating layer 14 is formed on the gate insulating layer 13. The source/drain pattern 15 then is formed on the interlayer insulating layer 14 and a planarizing layer 16 covering the source/drain pattern 15 and the interlayer insulating layer 14 are then formed. A common electrode pattern 17 is disposed on the planarizing layer 16. A passivation layer 18 covering the common electrode pattern 17 and the planarizing layer 16 are then formed. A pixel electrode pattern 19 is disposed on the passivation layer 18. Besides, a buffer layer 23 is formed on the substrate 11. In one embodiment, the semiconductor pattern 12 is formed in the buffer layer 23. Furthermore, a first contact hole 21 is formed in the planarizing layer 16 and the passivation layer 18 such that the pixel electrode pattern 19 electrically contacts with the source/drain pattern 15 through the first contact hole 19, and a second contact hole 22 is formed in the gate insulating layer 13 and the interlayer insulating layer 14 such that the source/drain pattern 15 contacts with the semiconductor pattern 12 through the second contact hole 22. Thus the electrical connection between each layers of the entire display panel 1 is achieved.

In this embodiment, the metal electrode 201 is formed on the passivation layer, and the metal electrode 201 is spaced apart from the pixel electrode pattern 19. In order to make the display panel 1 with the touch function have high resolution, a large amount of the metal electrode 201 is closely arranged on the same layer and the metal electrode 201 is spaced apart from the pixel electrode pattern 19. The distance is usually smaller or equivalent to 5 um.

S12: oxidizing the metal electrode 201 to form a metal oxide layer 202 on the surface of the metal electrode 201.

The small distance between the metal electrode 201 and the pixel electrode pattern 19 spaced apart from the metal electrode 201 easily results in a short circuit. Therefore, in this embodiment, the metal electrode 201 is oxidized by using UV-ozone or oxygen plasma.

For example, as shown in FIG. 2, the metal electrode 201 is oxidized by using UV-ozone. Under the irradiation of the ultraviolet 24, the energy of the ultraviolet 24 decomposes the ozone $O_3$ into oxygen $O_2$ and an active oxygen atom (O). The strong oxidation of the active oxygen atom (O) may result in chemical reaction with the metal electrode. Thus, a dense and insulating metal oxide layer 202 may be formed on the surface of the metal electrode 201 such that the metal oxide layer 202 may prevent a short circuit between the metal oxide layer 202 and the surrounding circuit and may prevent the corrosion caused by the moisture and oxygen in the air on the metal electrode 201. In the meanwhile, the thickness of the metal oxide layer 202 may be increased for avoiding the conductivity of the metal electrode 201. And because the pixel electrode pattern 19 is usually an oxide, the UV-ozone treatment would not have affection on the conductivity of the metal electrode 201.

Furthermore, if the oxygen plasma is used to proceed the oxidation treatment on the metal electrode 201, a part of the oxygen molecules from the plasma generated by the inductively coupled plasma approach (ICP) transform into oxygen atoms (O) or irons with strong oxidation such that the oxidation occurs on the surface of the metal electrode 201 to form a dense and insulating metal oxide layer 202.

Therefore, the disclosure uses UV-ozone or oxygen plasma to proceed with the oxidation treatment on the metal electrode 201 such that a dense and insulating metal oxide layer 202 is formed on the surface of the metal electrode 201. Thus a composite electrode 20 having the metal electrode 201 and the metal oxide layer 202 is formed. The composite electrode 20 is a touch electrode, and may be used for a display panel, a touch panel or a display panel having the touch function. The metal oxide layer 202 insulates the metal electrode 201 from the surrounding conductive elements to prevent a short circuit is formed between the electrode and the surrounding circuits. The yield of the panel is increased.

In summary, the display panel having the touch function according to the disclosure comprises a composite electrode comprising a metal electrode and a metal oxide layer formed on the surface of the metal electrode. Therefore, the disclosure may prevent the metal electrode 201 from forming a short circuit with the surrounding circuits. Thus the yield for the display panel with a touch function is increased and the cost is reduced.

Note that the specifications relating to the above embodiments should be construed as exemplary rather than as limitative of the present disclosure. The equivalent variations and modifications on the structures or the process by reference to the specification and the drawings of the disclosure, and application to the other relevant technology fields directly or indirectly should be construed as falling within the protection scope of the disclosure.

What is claimed is:

1. A display panel with a touch function, comprising: a common electrode pattern, a passivation layer covering the common electrode pattern, a pixel electrode pattern disposed on the passivation layer such that the passivation layer is located between the common electrode pattern and the pixel electrode pattern, and a composite electrode disposed on the passivation layer and spaced apart from the pixel electrode patter; wherein the composite electrode comprises a metal electrode and an insulating metal oxide layer formed on the surface of the metal electrode.

2. The display panel according to claim 1, wherein the metal oxide layer is formed by oxidizing the metal electrode.

3. The display panel according to claim 1, wherein the metal oxide layer is formed by oxidizing the metal electrode using UV-ozone or oxygen plasma.

4. The display panel according to claim 1, wherein the metal electrode comprises a single metal layer, at least two metal layers or a metal alloy layer.

5. The display panel according to claim 1, wherein the metal oxide layer electrically isolates the metal electrode from surrounding conductive elements.

6. The display panel according to claim 1, wherein the composite electrode is a touch electrode of the display panel.

7. The display panel according to claim 6, wherein the display panel further comprises a substrate, a semiconductor pattern formed on the substrate, a gate insulating layer and a interlayer insulating layer covering the semiconductor pattern and the substrate, a source/drain pattern disposed on the interlayer insulating layer, a planarizing layer covering the source/drain pattern and the interlayer insulating layer; wherein the common electrode pattern is disposed on the planarizing layer, the passivation layer is disposed covering the common electrode pattern and the planarizing layer; wherein a first contact hole is formed in the planarizing layer and the passivation layer such that the pixel electrode pattern electrically contacts with the source/drain pattern through the first contact hole, and a second contact hole is formed in the gate insulating layer and the interlayer insulating layer such that the source/drain pattern contacts with the semiconductor pattern through the second contact hole.

8. A method for manufacturing a display panel having a touch function, comprising:
    forming a common electrode pattern, a passivation layer covering the common electrode pattern, and a pixel electrode pattern disposed on the passivation layer such that the passivation layer being located between the common electrode pattern and the pixel electrode pattern;
    forming a metal electrode on the passivation layer and spaced apart from the pixel electrode patter; and
    oxidizing the metal electrode to form an insulating metal oxide layer on the surface of the metal electrode.

9. The method for manufacturing a display panel having a touch function according to claim 8, wherein the step of oxidizing the metal electrode comprises: oxidizing the metal electrode by using UV-ozone or oxygen plasma.

10. The method for manufacturing a display panel having a touch function according to claim 8, further comprising:

providing a substrate;

forming a semiconductor pattern formed on the substrate, a gate insulating layer and a interlayer insulating layer covering the semiconductor pattern and the substrate, a source/drain pattern disposed on the interlayer insulating layer, and a planarizing layer covering the source/drain pattern and the interlayer insulating layer;

wherein the common electrode pattern is disposed on the planarizing layer, the passivation layer is disposed covering the common electrode pattern and the planarizing layer;

wherein a first contact hole is formed in the planarizing layer and the passivation layer such that the pixel electrode pattern electrically contacts with the source/drain pattern through the first contact hole, and a second contact hole is formed in the gate insulating layer and the interlayer insulating layer such that the source/drain pattern contacts with the semiconductor pattern through the second contact hole;

wherein the metal electrode and the insulating metal oxide layer form a touch electrode of the display panel.

11. A composite electrode adopted for a display panel or a touch panel including a first electrode pattern, a passivation layer covering the first electrode pattern, and a second electrode pattern disposed on the passivation layer such that passivation layer being located between the first electrode pattern and the second electrode pattern, wherein the composite electrode comprises a metal electrode and an insulating metal oxide later formed on the surface of the metal electrode, and the composite electrode is adapted for being disposed on the side of the passivation layer away from the first electrode pattern and being spaced apart from the second electrode pattern.

12. The composite electrode according to claim 11, wherein the metal oxide layer is formed by oxidizing the metal electrode.

13. The composite electrode according to claim 11, wherein the metal oxide layer is formed by oxidizing the metal electrode using UV-ozone or oxygen plasma.

14. The composite electrode according to claim 11, wherein the metal electrode comprises a single metal layer, at least two metal layers or a metal alloy layer.

15. The composite electrode according to claim 11, wherein the metal oxide layer electrically isolates the metal electrode from the surrounding the conductive elements.

* * * * *